United States Patent
Wang

(10) Patent No.: US 7,750,658 B2
(45) Date of Patent: Jul. 6, 2010

(54) INTEGRATED CIRCUIT AND TESTING CIRCUIT THEREIN FOR TESTING AND FAILURE ANALYSIS

(76) Inventor: Jing-Syun Wang, No. 222, Sidiao Rd., Haosiou Village, Hemei Town, Changhua County (TW) 508

( * ) Notice: Subject to any disclaimer, the term of this patent is extended or adjusted under 35 U.S.C. 154(b) by 191 days.

(21) Appl. No.: 12/016,216

(22) Filed: Jan. 18, 2008

(65) Prior Publication Data

US 2008/0303542 A1 Dec. 11, 2008

(30) Foreign Application Priority Data

Jun. 5, 2007 (TW) .............................. 96120187 A

(51) Int. Cl.
 *G01R 31/02* (2006.01)
(52) U.S. Cl. ...................... 324/763; 324/158.1; 324/537
(58) Field of Classification Search ...................... None
 See application file for complete search history.

(56) References Cited

U.S. PATENT DOCUMENTS

| | | | | | |
|---|---|---|---|---|---|
| 3,549,561 | A | * | 12/1970 | Westerveld et al. | 252/520.2 |
| 4,638,246 | A | * | 1/1987 | Blank et al. | 324/500 |
| 4,707,654 | A | * | 11/1987 | Suzuki et al. | 324/763 |
| 4,779,041 | A | * | 10/1988 | Williamson, Jr. | 324/537 |
| 4,894,605 | A | * | 1/1990 | Ringleb et al. | 324/537 |

* cited by examiner

*Primary Examiner*—Vinh P Nguyen
(74) *Attorney, Agent, or Firm*—Pai Patent & Trademark Law Firm; Chao-Chang David Pai

(57) ABSTRACT

A testing circuit includes at least two contact terminals and a plurality of first resistors. The contact terminals are located on a substrate and respectively connected to two ends of an original circuit on the substrate. The first resistors are embedded in the substrate and respectively connected to a plurality of devices of the original circuit in parallel or in series.

14 Claims, 7 Drawing Sheets

INTEGRATED CIRCUIT AND TESTING CIRCUIT THEREIN FOR TESTING AND FAILURE ANALYSIS

RELATED APPLICATIONS

This application claims priority to Taiwan Application Serial Number 96120187, filed Jun. 5, 2007, which is herein incorporated by reference.

BACKGROUND

1. Field of Invention

The present invention relates to fault detection for electric circuits and electronic devices. More particularly, the present invention relates to subject matter that fault can be detected by measuring resistance or impedance value.

2. Description of Related Art

Begin from the first invention of integrated circuit in 1960, the number of electronic devices on a chip has been increased in an explosive rate. The function, capacity, and operational speed of the integrated circuits have been greatly improved with the progress of the semiconductor integrated circuits has step into ULSI (ultra large scale integration) or even higher level. The capacity of a single semiconductor chip is increased from several thousands to hundreds of millions, or even billions of devices. Thus, functional inspection and quality control for manufactured chips with such highly integrated circuits have become quite important processes to ensure chip operation and reliability.

SUMMARY

According to one embodiment of the present invention, a testing circuit includes at least two contact terminals and a plurality of first resistors. The contact terminals are located on a substrate and respectively connected to two ends of an original circuit on the substrate. The first resistors are embedded in the substrate and respectively connected to a plurality of devices of the original circuit in parallel or in series.

According to another embodiment of the present invention, an integrated circuit includes a substrate, an original circuit, at least two contact terminals and a plurality of first resistors. The original circuit is located on the substrate, and this original circuit has a plurality of tested parts. The contact terminals are respectively connected to two ends of the original circuit. The first resistors are embedded in the substrate and respectively connected to the tested parts of the original circuit in series.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
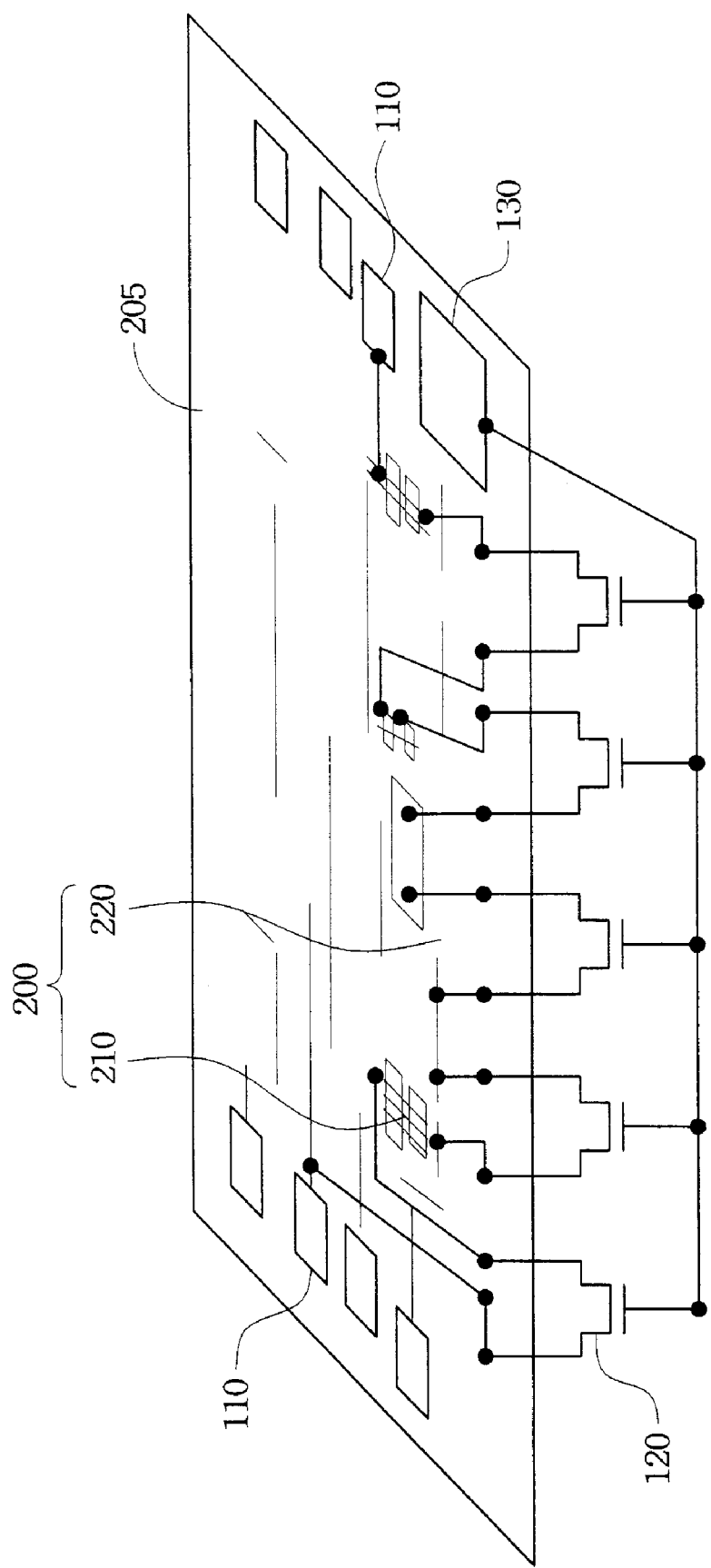
FIG. 1 shows a testing circuit according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
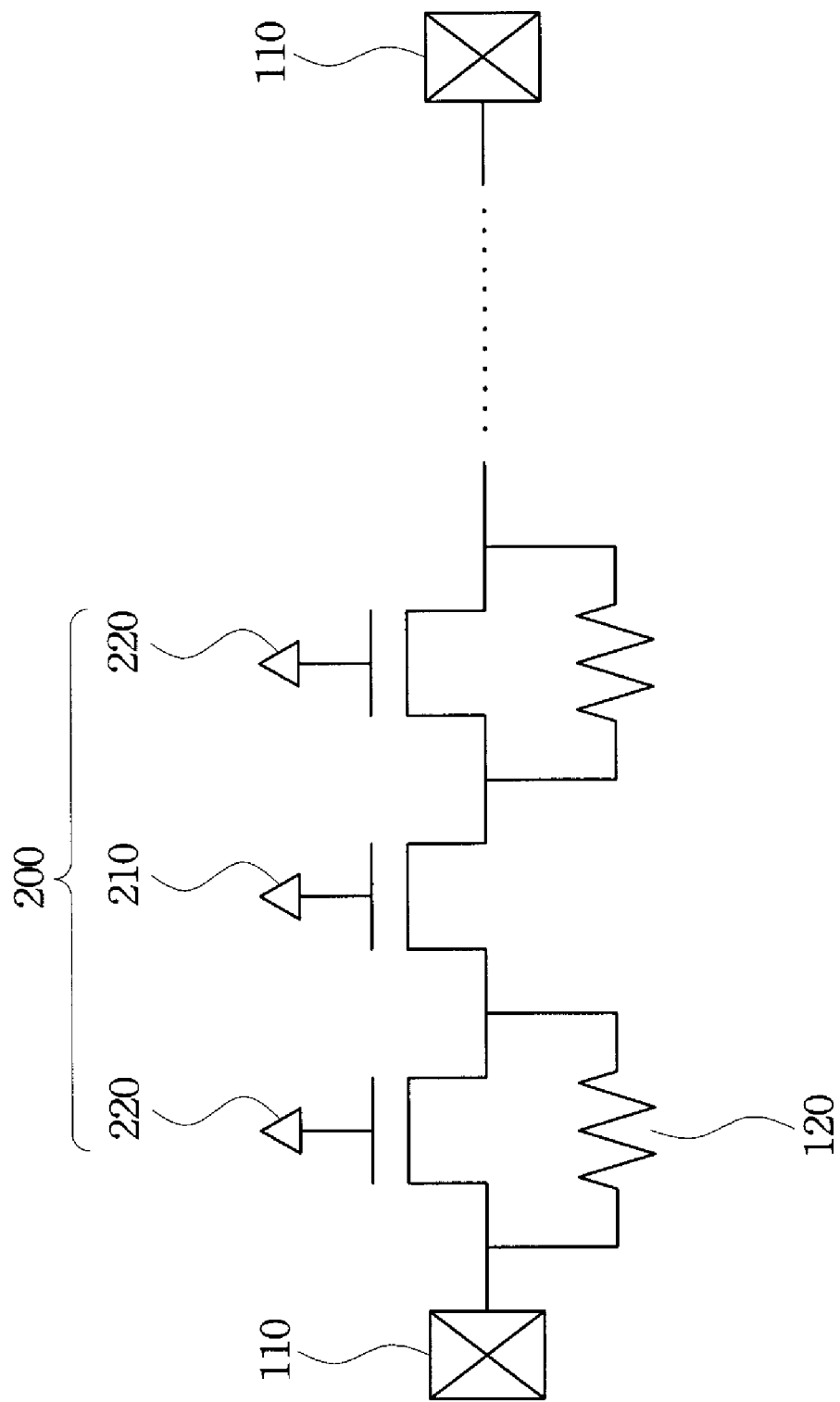
FIG. 2 is an equivalent circuit diagram of the original circuit and the testing circuit shown in FIG. 1.

FIG. 1 shows a testing circuit according to one embodiment of the present invention, and FIG. 2 is an equivalent circuit diagram of the original circuit and the testing circuit shown in FIG. 1. A testing circuit includes at least two contact terminals 110 and a plurality of first resistors 120. The contact terminals 110 are located on a substrate 205 and respectively connected to two ends of an original circuit 200 on the substrate 205. The first resistors 120 are embedded in the substrate 205 and respectively connected to a plurality of devices of the original circuit 200 in parallel or in series.

The substrate 205 may be a wafer or a die made of any proper material, such as strained silicon, strained silicon-on-insulator, silicon-germanium, strained silicon-germanium, silicon-germanium on insulator, germanium, strained germanium, germanium on insulator (GeOI), strained germanium on insulator, strained semiconductor, compound semiconductor or multi-layers semiconductor. On the other hand, the original circuit 200 may be the functional elements originally on the substrate 205, for example radio frequency integrated circuits (RF ICs).

Specifically, the original circuit 200 may have a plurality of tested parts 210 and a plurality of non-tested parts 220. The first resistors 120 are respectively connected to the tested parts 210 of the original circuit 200 in series. Furthermore, the first resistors 120 are also respectively connected to the non-tested parts 220 of the original circuit 200 in parallel.

User may disable the original circuit 200 and then measure the resistance between the two contact terminals 110 to detect faults in the tested parts 210 of the original circuit 200. Specifically, the resistance between the two contact terminals 110 should be substantially equal to the sum of the resistances of the first resistors 120 when there is no fault in the tested parts 210 of the original circuit 200. In other words, there is at least one fault in the tested parts 210 of the original circuit 200 when the resistance between the two contact terminals 110 is not equal to the sum of the resistances of the first resistors 120.

As shown in FIG. 1, each of the first resistors 120 may be a transistor, and the testing circuit may further include a testing terminal 130 connected to the gate electrodes of the transistors, i.e. the first resistors 120. User may apply a specific voltage on the testing terminal 130 when operating the testing circuit, wherein the specific voltage is appropriate for biasing the transistors in the linear region to perform the first resistors 120. On the other hand, user may also employ this testing terminal 130 to disable the transistors when operating the original circuit 200. Consequently, the testing circuit will not influence the operation of the original circuit 200. Although the testing terminal 130 is shown as a testing node in FIG. 1, the testing terminal 130 may also be other devices.

For example, user may employ other circuit designs or switches to bias the transistors in the linear region.

Although each of the first resistors 120 is shown as a N-type transistor in FIG. 1, the first resistors 120 may also be other transistors, for example P-type transistors, complementary metal-oxide semiconductor devices, junction field-effect transistors, PNP-type transistors or NPN-type transistors.

Besides active devices, the first resistors 120 may also be passive devices, e.g. capacitors, inductors or real resistors, for example, made of a semiconductor material.

Furthermore, each of the first resistors 120 may be made of a conductive material or a semiconductor material. For example, the resistances of conductive lines may be employed to perform the first resistors 120.

Figure 3A:
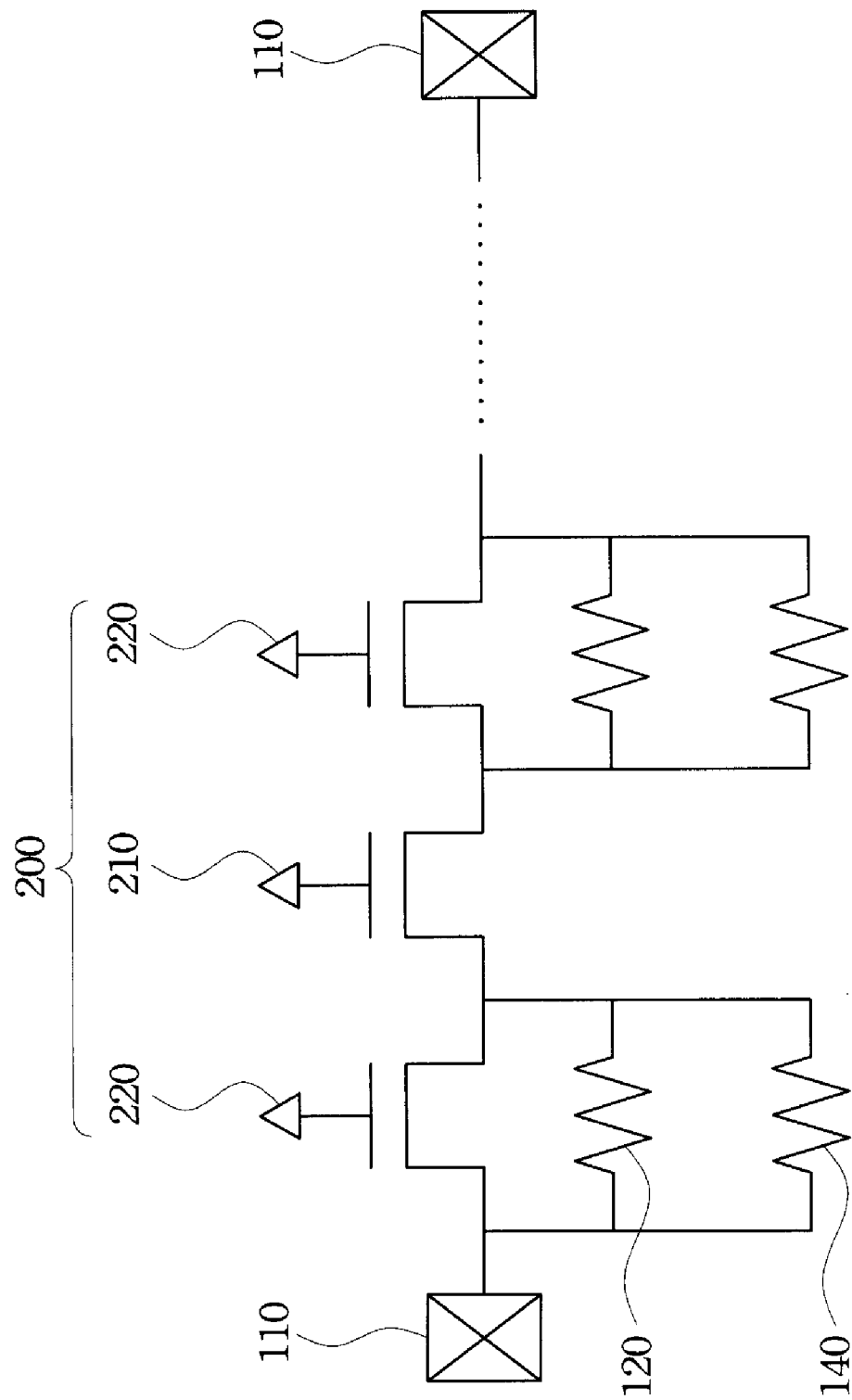
FIG. 3A is an equivalent circuit diagram of the original circuit and the testing circuit according to another embodiment of the present invention.
Figure 3B:
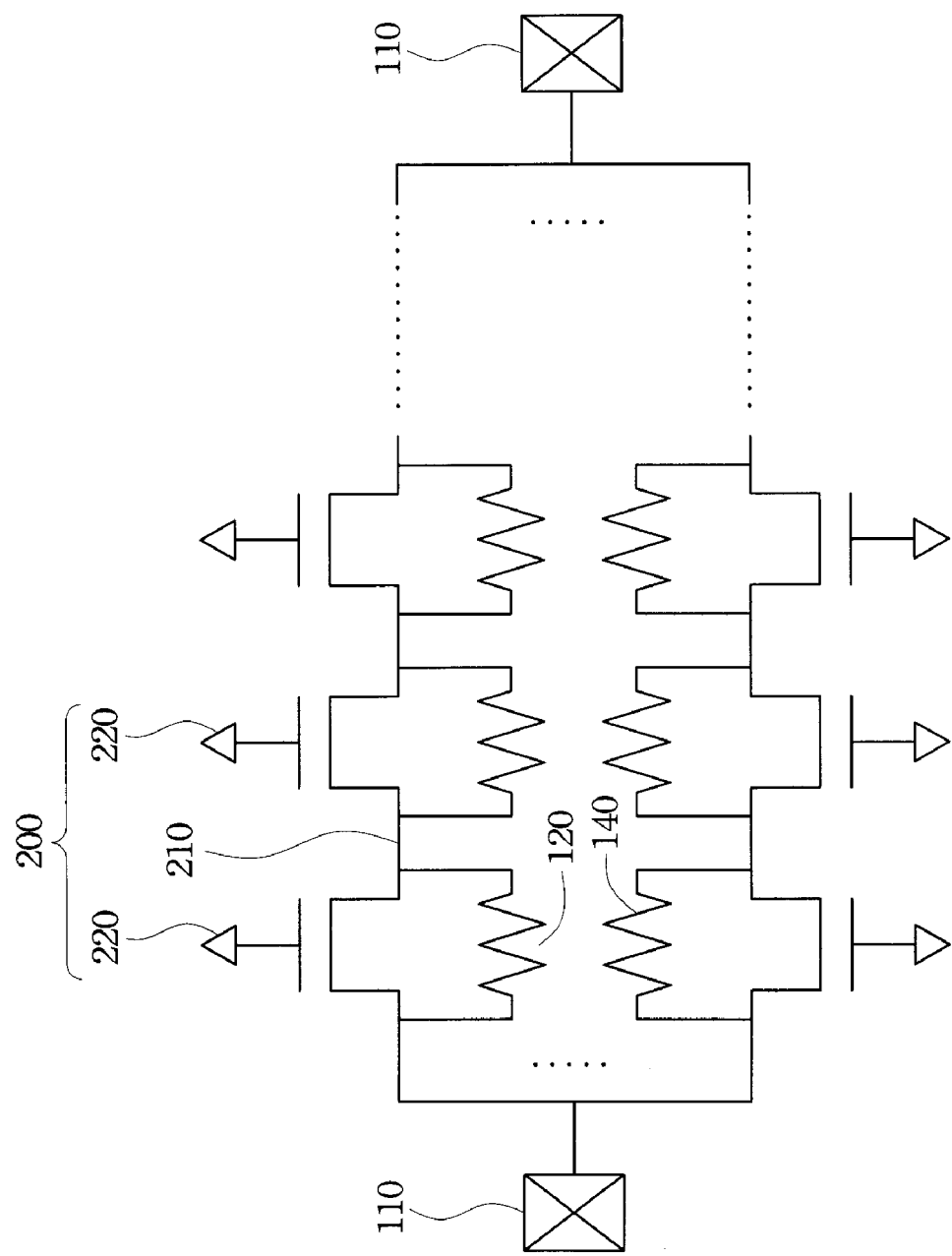
FIG. 3B is an equivalent circuit diagram of the original circuit and the testing circuit according to yet another embodiment of the present invention.

FIG. 3A is an equivalent circuit diagram of the original circuit and the testing circuit according to another embodiment of the present invention. The testing circuit shown in FIG. 3A may further include a plurality of second resistors 140 respectively connected to the first resistors 120 in parallel. More particularly, the first resistors 120 and the second resistors 140 may be embedded into different layers of the substrate to detect faults in each layer of the substrate. It is easily understood that the above-mentioned arrangement is only one example. Other arrangements may also be proper. For example, the first resistors 120 and the second resistors 140 may be embedded into different columns or rows of the substrate to detect faults in each columns or rows of the substrate (as shown in FIG. 3B).

Figure 4:
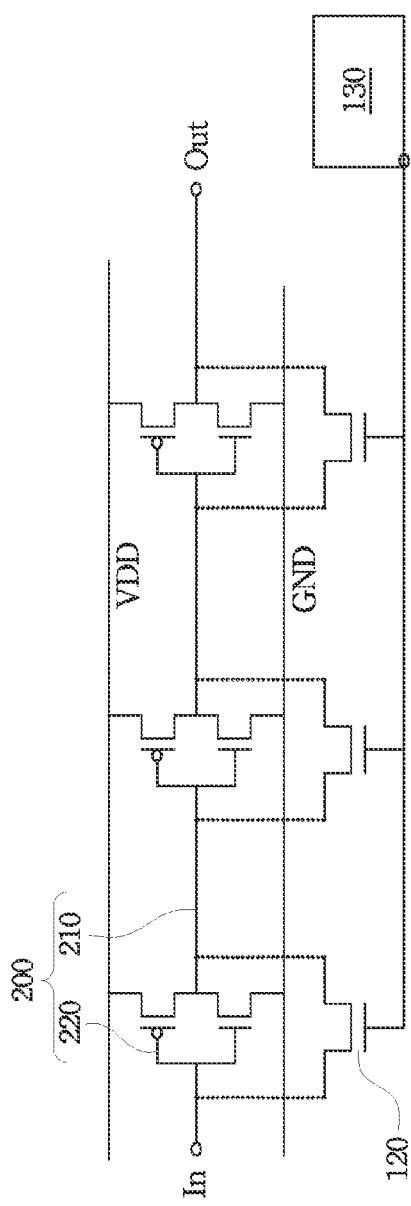
FIG. 4 is an equivalent circuit diagram of the original circuit and the testing circuit according to still another embodiment of the present invention.
Figure 5:
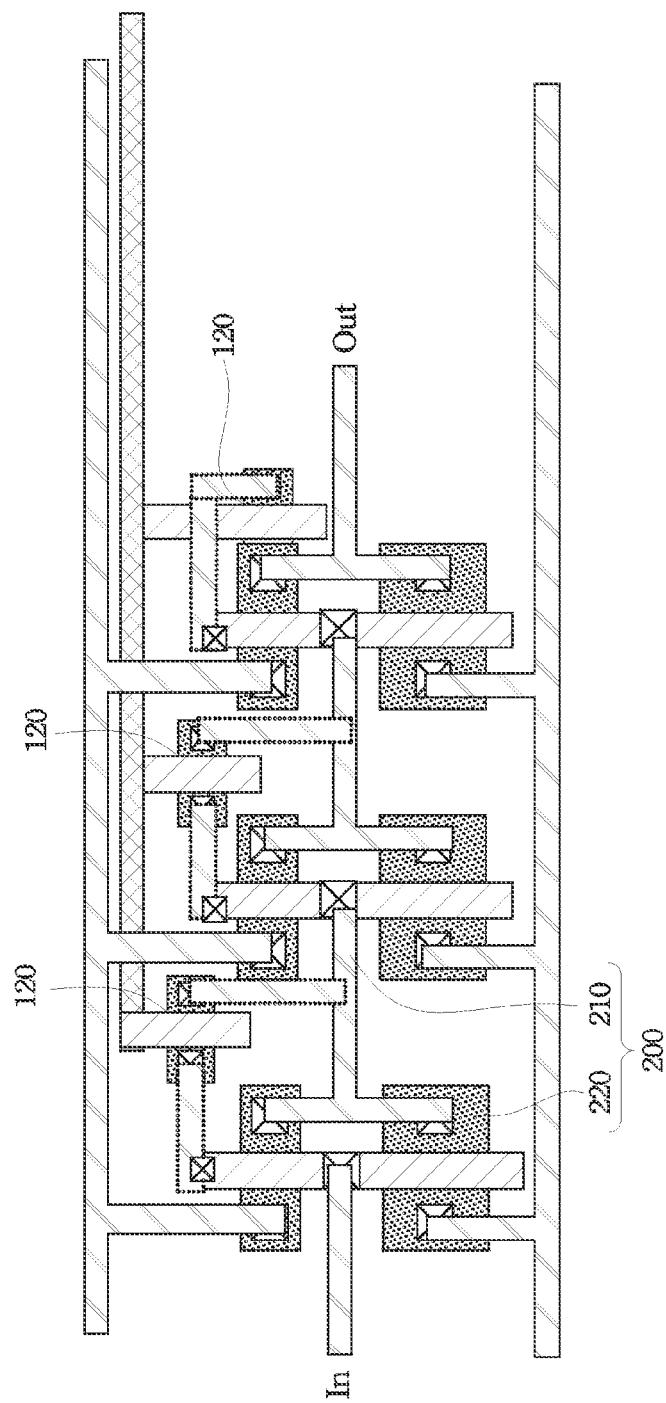
FIG. 5 illustrates the circuit layout of the original circuit and the testing circuit of FIG. 4.

FIG. 4 is an equivalent circuit diagram of the original circuit and the testing circuit according to still another embodiment of the present invention, and FIG. 5 illustrates the circuit layout of the original circuit and the testing circuit of FIG. 4. When the original circuit 200 includes a plurality of inverters, the first resistors 120 may be connected to the inverters of the original circuit 200 in parallel respectively, and the circuit layout is shown in FIG. 5.

Figure 6:
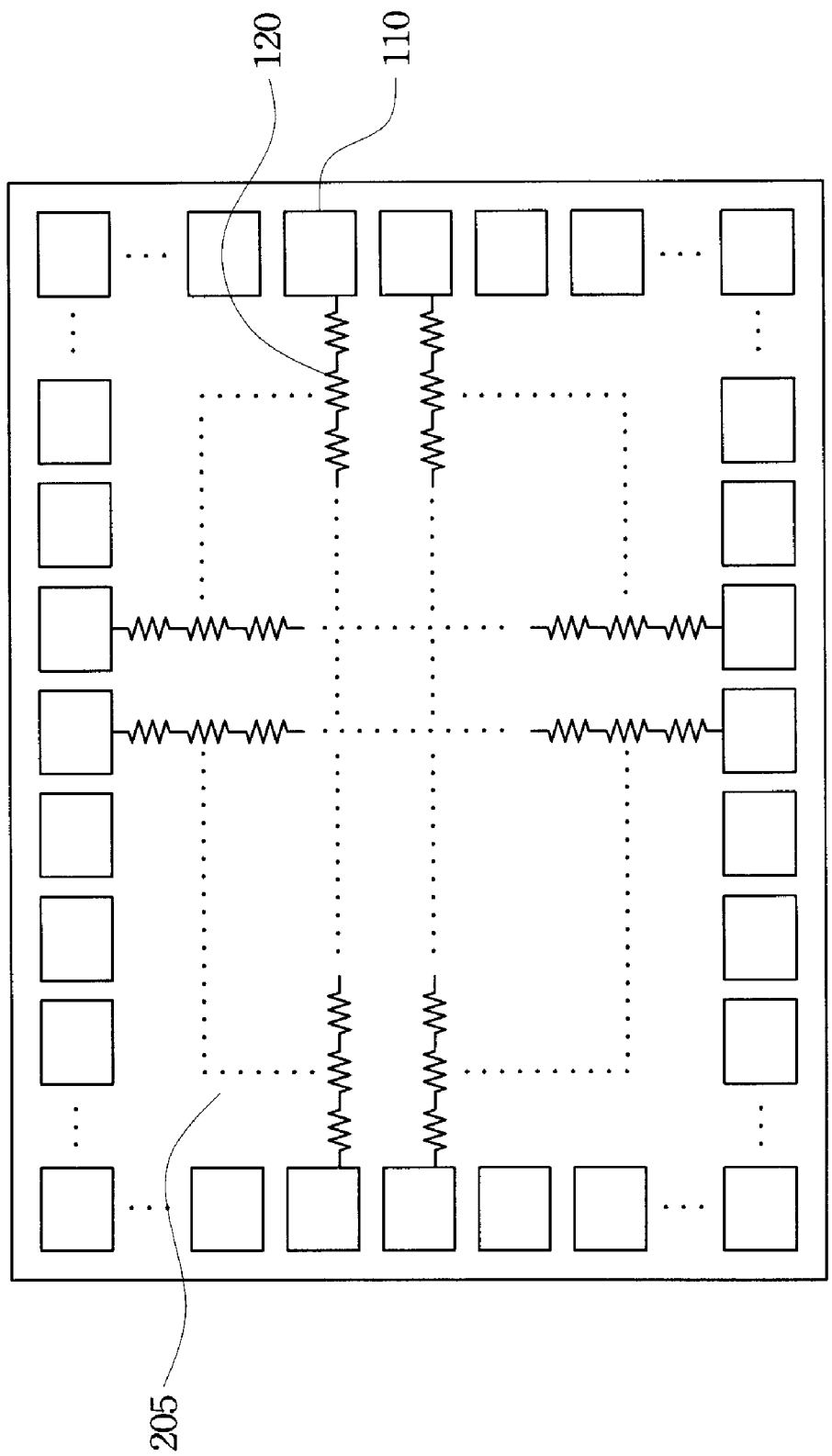
FIG. 6 shows another testing circuit according to yet another embodiment of the present invention.

FIG. 6 shows another testing circuit according to yet another embodiment of the present invention. The first resistors 120 may be arranged in a matrix pattern in the substrate 205. As the density of the first resistors 120 increases, the percentage of the tested parts of the original circuit increases as well, i.e. the testing result will be more representative.

Figure 7:
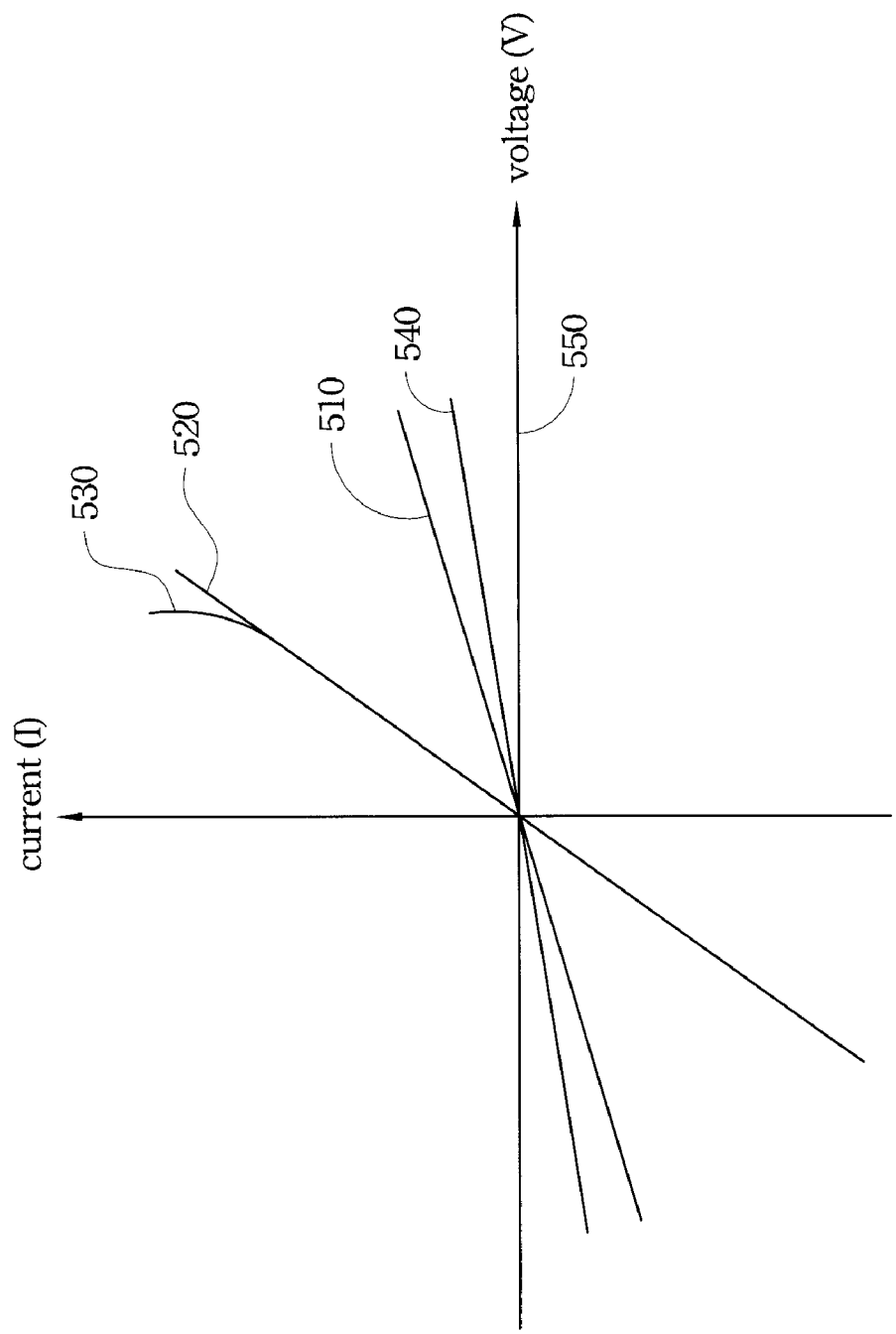
FIG. 7 shows voltage v.s. current curves obtained when operating the testing circuit.

The following will disclose how to detect faults in the tested parts of the original circuit with reference made to FIG. 7. When operating the testing circuit, user may disable the original circuit first. Then, various voltages are applied between the two contact terminals of the testing circuit, and the currents between the two contact terminals of the testing circuit are measured at the same time to plot a voltage v.s. current curve. The voltage v.s. current curve 510 of FIG. 7 is obtained when there is no fault in the tested parts of the original circuit, wherein the slope of the voltage v.s. current curve 510 should be substantially equal to the inverse of the total resistance of the first resistors.

The voltage v.s. current curve 520 of FIG. 7 is obtained when there is at least one short fail or lower resistance fail in the tested parts of the original circuit, wherein the slope of the voltage v.s. current curve 520 should be larger than the inverse of the total resistance of the first resistors. Furthermore, the location of the short fail or lower resistance fail may be found by measuring the resistance between the two contact terminals. For example, assuming that the resistance of each first resistor is 1 ohm, and the number of the first resistors is 100, the resistance between the two contact terminals should be 100 ohm when there is no fault in the tested parts of the original circuit. If the resistance between the two contact terminals is measured as 55 ohm, there is a short fail or a lower resistance fail located near the fiftieth-five first resistors from one of the contact terminals.

The voltage v.s. current curve 530 of FIG. 7 is obtained when there is at least one leakage fail in the tested parts of the original circuit. The voltage v.s. current curve 540 of FIG. 7 is obtained when there is at least one higher resistance fail in the tested parts of the original circuit. The voltage v.s. current curve 550 of FIG. 7 is obtained when there is at least one open fail in the tested parts of the original circuit.

Consequently, user can detect faults, identify the faults and find the locations of the faults in the tested parts of original circuit by plotting the voltage v.s. current curve. The testing circuit may also cooperate with fault analysis tools to analyze what causes faults.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A testing circuit, comprising:
   at least two contact terminals located on a substrate and respectively connected to two ends of a circuit on the substrate;
   a plurality of first resistors embedded in the substrate and respectively connected to a plurality of devices of the circuit in parallel or in series, wherein each of the first resistors is implemented by a transistor; and
   a testing terminal connected to the gate electrodes of the transistors, wherein the testing terminal is a testing node;
   wherein when the circuit is disabled, a voltage is applied between the two contact terminals and a current is generated therebetween, and fails in the circuit are detected by checking a relationship between the voltage with respect to the current and an inverse of total resistance of the first resistors.

2. The testing circuit of claim 1, wherein the first resistors are respectively connected to the devices of the circuit in parallel.

3. The testing circuit of claim 1, wherein the first resistors are respectively connected to the devices of the circuit in series.

4. The testing circuit of claim 1, wherein the transistor is a P-type transistor, an N-type transistor, a complementary metal-oxide semiconductor device, a junction field-effect transistor, a PNP-type transistor or an NPN-type transistor.

5. The testing circuit of claim 1, wherein each of the first resistors is made of a conductive material.

6. The testing circuit of claim 1, wherein each of the first resistors is made of a semiconductor material.

7. The testing circuit of claim 1, further comprising a plurality of second resistors respectively connected to the first resistors in parallel.

8. An integrated circuit, comprising:
   a substrate;
   a circuit located on the substrate and having a plurality of tested parts;
   at least two contact terminals respectively connected to two ends of the circuit;
   a plurality of first resistors embedded in the substrate and respectively connected to the tested parts of the circuit in series, wherein each of the first resistors is implemented by a transistor; and a testing terminal connected to the gate electrodes of the transistors, wherein the testing terminal is a testing node;

wherein when the circuit is disabled, a voltage is applied between the two contact terminals and a current is generated therebetween, and fails in the circuit are detected by checking a relationship between the voltage with respect to the current and an inverse of total resistance of the first resistors.

9. The integrated circuit of claim 8, wherein the circuit has a plurality of non-tested parts, and the first resistors are respectively connected to the non-tested parts of the circuit in parallel.

10. The integrated circuit of claim 8, wherein the transistor is a P-type transistor, an N-type transistor, a complementary metal-oxide semiconductor device, a junction field-effect transistor, a PNP-type transistor or an NPN-type transistor.

11. The integrated circuit of claim 8, wherein each of the first resistors is made of a conductive material.

12. The integrated circuit of claim 8, wherein each of the first resistors is made of a semiconductor material.

13. The integrated circuit of claim 8, further comprising a plurality of second resistors respectively connected to the first resistors in parallel.

14. The integrated circuit of claim 8, wherein the substrate is a wafer or a die.

* * * * *